US006979617B2

(12) United States Patent
Lee

(10) Patent No.: US 6,979,617 B2
(45) Date of Patent: Dec. 27, 2005

(54) METHOD FOR FABRICATING FLASH MEMORY DEVICE

(75) Inventor: Sang Bum Lee, Incheon (KR)

(73) Assignee: Anam Semiconductor Ltd., Gyeonggi-do (KR)

( * ) Notice: Subject to any disclaimer, the term of this patent is extended or adjusted under 35 U.S.C. 154(b) by 0 days.

(21) Appl. No.: 10/879,269

(22) Filed: Jun. 30, 2004

(65) Prior Publication Data

US 2005/0245028 A1  Nov. 3, 2005

(30) Foreign Application Priority Data

Apr. 30, 2004  (KR) ...................... 10-2004-0030648

(51) Int. Cl.⁷ ............................................. H01L 21/336
(52) U.S. Cl. ...................................... 438/257; 438/303
(58) Field of Search ............................... 438/257, 263, 438/264, 265, 266, 303

(56) References Cited

U.S. PATENT DOCUMENTS

| 5,494,838 A | * | 2/1996 | Chang et al. | ............... | 438/264 |
| 6,462,375 B1 | * | 10/2002 | Wu | ............................. | 257/316 |
| 6,803,276 B2 | * | 10/2004 | Kim et al. | .................. | 438/257 |

* cited by examiner

Primary Examiner—Phuc T. Dang
(74) Attorney, Agent, or Firm—Finnegan, Henderson, Farabow, Garrett & Dunner, L.L.P.

(57) ABSTRACT

A method for fabricating a flash memory device, to decrease a cell size by forming a control gate within a minimum line width permitted in the fabrication process, and to effectively obtain the operation characteristics even in case of the decrease of the cell size, which includes the steps of forming a gate pattern layer having a minimum line width (A) by stacking a material layer for gate and a cap insulating layer on an ONO layer of a semiconductor substrate, and primarily etching the stacked layers; forming an insulating layer for planarization on an entire substrate of the semiconductor substrate, and removing the cap insulating layer, to define a select gate formation region; forming a mask pattern layer of a sidewall shape in the select gate formation region, and secondarily etching the gate pattern layer by using the mask pattern layer, to form control gates; and forming a select gate isolated from the control gates in the select gate formation region, and forming source and drain junction regions in the surface of the semiconductor substrate at both sides of the select gate.

8 Claims, 16 Drawing Sheets

The related art

The related art 2 nitride storage sites

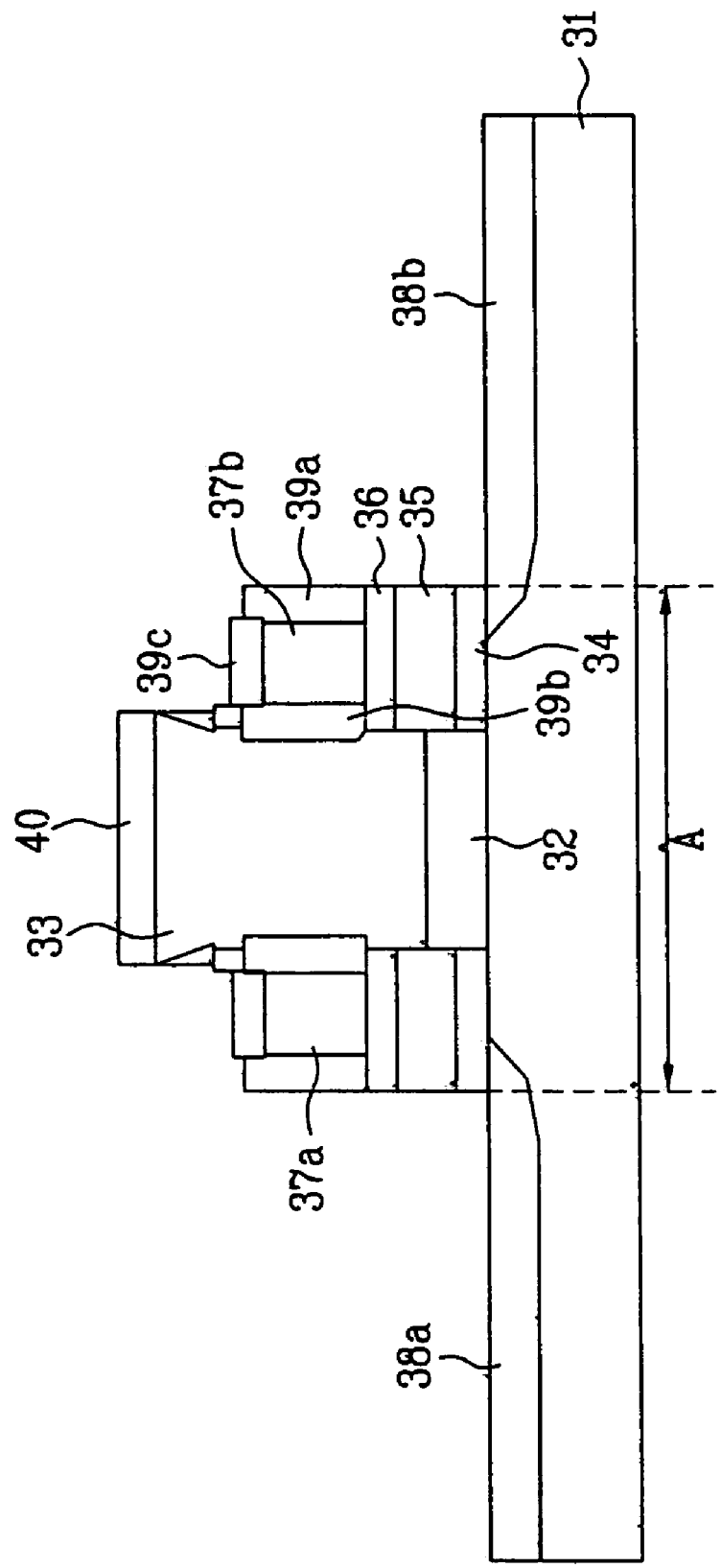

METHOD FOR FABRICATING FLASH MEMORY DEVICE

This application claims the benefit of the Korean Application No. P2004-30648 filed on Apr. 30, 2004, which is hereby incorporated by reference.

BACKGROUND OF THE INVENTION

1. Field of the Invention

The present invention relates to a semiconductor memory device, and more particularly, to a method for fabricating a flash memory device, to decrease a cell size by forming a control gate within a minimum line width permitted in the fabrication process.

2. Discussion of the Related Art

In recent, a nonvolatile memory device of SONOS (Polysilicon-Oxide-Nitride-Oxide-Semiconductor) has great attentions in that it is possible to overcome the disadvantageous characteristics of other nonvolatile memory devices. In case of the nonvolatile memory device of SONOS, a top oxide layer serves as a potential barrier for access to electric charges through a gate. Also, the top oxide layer generates a new memory trap of great density to an interface with a nitride layer. Accordingly, it is possible to obtain a thin gate insulating layer, especially, thin nitride layer, in state of maintaining a memory window size, thereby obtaining a high-efficiency nonvolatile memory device having a low programmable voltage for record and erase and low power consumption.

Hereinafter, a related art SONOS-type flash memory device will be described with reference to the accompanying drawings. FIG. 1 is a cross-sectional view illustrating a related art SONOS-type flash memory device. FIG. 2 is a TEM photograph illustrating a related art Twin MONOS flash memory device. The commonly used flash memory device is largely classified into a stacked gate flash cell device having a stacked structure of a control gate and a floating gate, and an SONOS flash cell device in which a single gate and a gate dielectric are stacked as an ONO (oxide/nitride/oxide) structure.

FIG. 1 is a cross-sectional view illustrating a flash memory device having an SONOS cell structure, wherein a tunnel oxide layer 12-a trap nitride 13-a block oxide layer 14, having the ONO structure, are sequentially stacked on a p-type semiconductor substrate 11. Then, an n-type polysilicon gate 15 is stacked on the ONO layer 12, 13 and 14, and n-type impurity regions 16 and 17 are formed in the surface of the semiconductor substrate 11 at both sides of the n-type polysilicon gate 15, whereby the n-type impurity regions 16 and 17 are formed as source and drain regions.

A programming and erasing operation of the aforementioned SONOS-type flash memory device will be described as follows.

On a programming mode, a predetermined positive (+) voltage is applied to the drain region 17 and the gate 15, and the source region 16 and the semiconductor substrate (body) 11 are ground. Under this condition, according as a bias is applied, channel electrons are accelerated by a lateral electric field formed from the source region 16 to the drain region 17, whereby the channel electrons become hot electrons around the drain region 17. Also, the hot electrons are locally trapped to a trap level of the trap nitride 13 around the drain region 17 over the potential barrier of the tunnel oxide layer 12, thereby increasing a threshold voltage. This programming method is referred to as CHEI (Channel Hot Electron Injection).

On an erasing mode, a predetermined positive (+) voltage is applied to the drain region 17, and a predetermined negative (−) voltage is applied to the gate 15. Also, the source region 16 and the semiconductor substrate 11 are ground. Under this condition, according as a bias is applied, a depletion region is formed in the n-type drain region 17 by a high electric field formed in an overlap area between the drain region 17 and the gate 15. In the depletion region, pairs of electron and hole are formed by band to band tunneling. Then, the electron eacapes to the n-type region, and the hole is accelerated by the lateral electric field of the depletion region, whereby the hole is changed to a hot hole. The hot hole is injected and trapped to a valence band of the trap nitride 13 over an energy barrier formed between the tunnel oxide layer 12 and the semiconductor substrate 11, thereby performing the erasing mode lowing the threshold voltage. This erasing method is referred to as HHI (Hot Hole Injection).

The maximization of HCI (Hot Carrier Injection) effect is very important to the characteristics of the SONOS-type flash memory device, especially, it becomes more important with generalization of low power consumption device. In the SONOS-type flash memory device of FIG. 1, the HHI erasing method is used to remove the electrons injected on the erasing mode. In this case, it is very difficult to inject the holes corresponding to the number of the electrons injected on the erasing mode. Thus, some of the electrons injected on the erasing mode are accumulated due to incorrectness of hole injection, thereby degrading endurance of the device.

In order to solve these problems, another cell structure is shown as FIG. 2. In FIG. 2, control gates CG having sidewall spacer type are formed at both sides of a word line WL, and nitride storage sites are formed below the control gates CG (Embedded Twin MONOS Flash Memories with 4 ns and 15 ns Fast Access Times; Tomoko Ogura, Nori Orura, . . . ; 2003 Symposium on VLSI Circuits Digest of Technical Papers). In this structure, the condition of bias applied to the programming and erasing modes will be shown as Table 1.

TABLE 1

| Operation Mode | Selected WL (unselected) | Selected BL (unselected) | Selected CG (unselected) | Electrical Characteristics |
|---|---|---|---|---|
| Read | 1.8 V (0 V) | 0 and 1.5 V (1.8 V) | 1.8 and >2.8 (1.8 V) | Ion > 60 μA/μm Ioff < 3.5 μA/μm |
| Program | 1.0 V (0 V) | 4.5 and 0 V (1.8 V) | 5.5 and >2.8 V (1.8 V) | Ipgm < 2 μA/bit Tpgm = 20 μs |
| Erase hot hole | 0 floating | 4.5 V (1.8 or 0 V) | −3 V (0 V) | Iers < 2 nA/bit Ters = 10–100 ms |

On the erasing mode by this bias condition, it is possible to improve efficiency of the hole injection by the control gate of the sidewall type, thereby improving endurance. However, the control gate of the sidewall type is formed outside a minimum line width (A) permitted in the fabrication process, thereby increasing a cell size. Thus, it is disadvantageous to miniaturization of the device and improvement of cell integration. Also, the control gate has the sidewall type by etch-back, thereby lowering yield.

SUMMARY OF THE INVENTION

Accordingly, the present invention is directed to a method for fabricating a flash memory device that substantially obviates one or more problems due to limitations and disadvantages of the related art.

An object of the present invention is to provide a method for fabricating a flash memory device, to decrease a cell size by forming a control gate within a minimum line width permitted in the fabrication process, and to effectively obtain the operation characteristics even in case of the decrease of the cell size.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for fabricating a flash memory device includes the steps of forming a gate pattern layer having a minimum line width (A) by stacking a material layer for gate and a cap insulating layer on an ONO layer of a semiconductor substrate, and primarily etching the stacked layers; forming an insulating layer for planarization on an entire substrate of the semiconductor substrate, and removing the cap insulating layer, to define a select gate formation region; forming a mask pattern layer of a sidewall shape in the select gate formation region, and secondarily etching the fate pattern layer by using the mask pattern layer, to form control gates; and forming a select gate isolated from the control gates in the select gate formation region, and forming source and drain junction regions in the surface of the semiconductor substrate at both sides of the select gate.

At this time, the cap insulating layer is formed by stacking an oxide layer and a nitride layer, the nitride layer is removed in the process of defining the select gate formation region, and the oxide layer remains.

Also, before forming the insulating layer for planarization, the side portions of the exposed material layer for gate are oxidized, and a nitride layer acting as an etch-blocking layer is formed on the entire surface of the semiconductor substrate.

Also, the ONO layer is primarily patterned by using the mask pattern layer after formation of the control gates, and then secondarily patterned after formation of the select gate, so that the ONO layer remains below the control gates.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 3 is a cross-sectional view illustrating a flash memory device, according to the present invention.

DETAILED DESCRIPTION OF THE INVENTION

Figure 1:
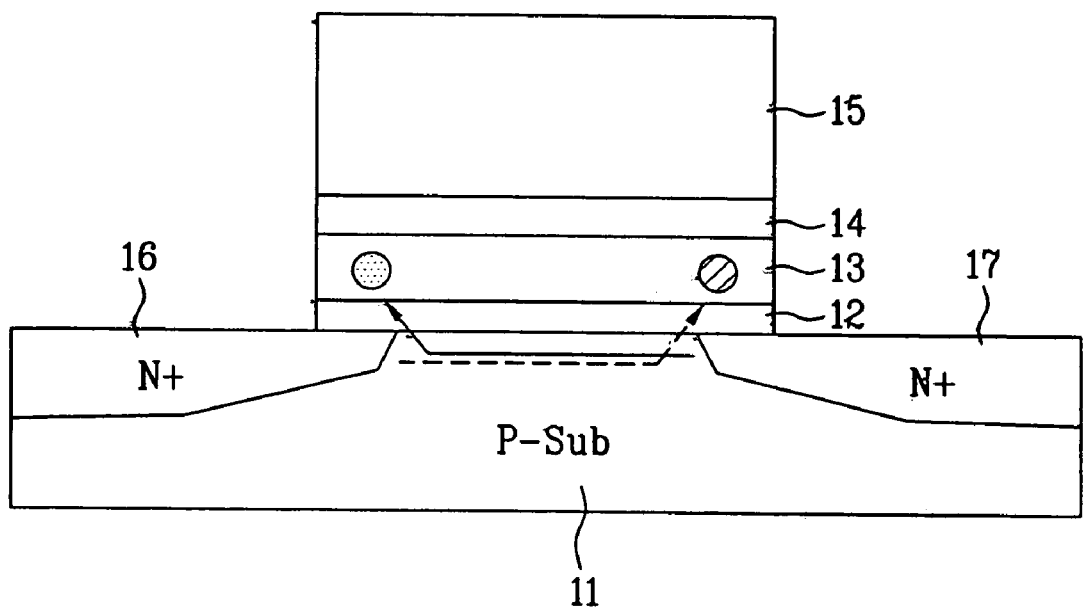
FIG. 1 is a cross-sectional view illustrating a related art SONOS-type flash memory device.

Reference will now be made in detail to the preferred embodiments of the present invention, examples of which are illustrated in the accompanying drawings. Wherever possible, the same reference numbers will be used throughout the drawings to refer to the same or like parts.

Hereinafter, a method for fabricating a flash memory device according to the preferred embodiment of the present invention will be described with reference to the accompanying drawings.

FIG. 3 is a cross-sectional view illustrating a flash memory device according to the present invention. In the flash memory device according to the present invention, a control gate is formed within a minimum line width (A) permitted in the fabrication process. For this, a material layer for a gate is primarily patterned at the minimum line width (A), and then the primarily patterned material layer for the gate is secondly etched using a sidewall-shaped mask pattern layer by etch-back process, thereby forming control gates. After that, a select gate is formed between the control gates. In the flash memory device according to the present invention, the control gate is formed within the minimum line width of the fabrication process, when having the control gate for effectiveness of hole injection on an erasing operation mode.

Referring to FIG. 3, the select gate 33 is formed on agate insulating layer 32 of a semiconductor substrate 31. Then, ONO layers are formed at both sides of the select gate 33, wherein each ONO layer is formed in a method of stacking a tunnel oxide layer 34, a trap nitride layer 35, and a block oxide layer 36. Also, control gates 37a and 37b are formed on the ONO layers. At this time, the select gate 33 and the control gates 37a and 37b are formed within the minimum line width (A) permitted in the fabrication process. Then, source and drain junction regions 38a and 38b are formed in the surface of the semiconductor substrate 31 at both sides of the select gate 33 and the control gates 37a and 37b. The control gates 37a and 37b are isolated from the select gate 33 and other conductive layers by insulating layers 39a, 39b and 39c, and a cap gating layer 40 is formed on the select gate 33.

A method for fabricating the aforementioned flash memory device according to the present invention will be described as follows. FIG. 4A to FIG. 4M are crowssectional views illustrating the fabrication process of the flash memory device according to the present invention.

Figure 4A:
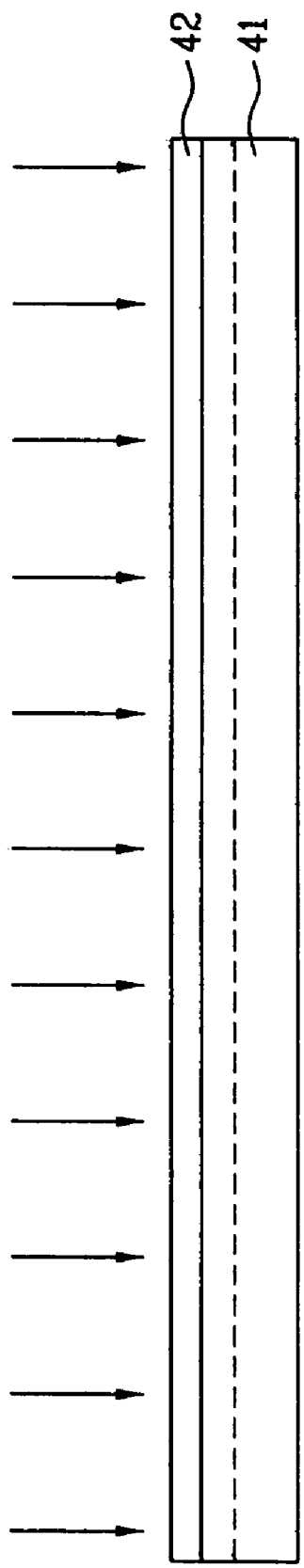
FIG. 4A to FIG. 4M are cross-sectional views illustrating the fabrication process of a flash memory device according to the present invention.

As shown in FIG. 4A, a buffer oxide layer 42 is formed on a semiconductor substrate 41, and then ion implantation is processed to form a well region (not shown) in the surface of the semiconductor substrate 41, and to control a threshold voltage.

Figure 4B:
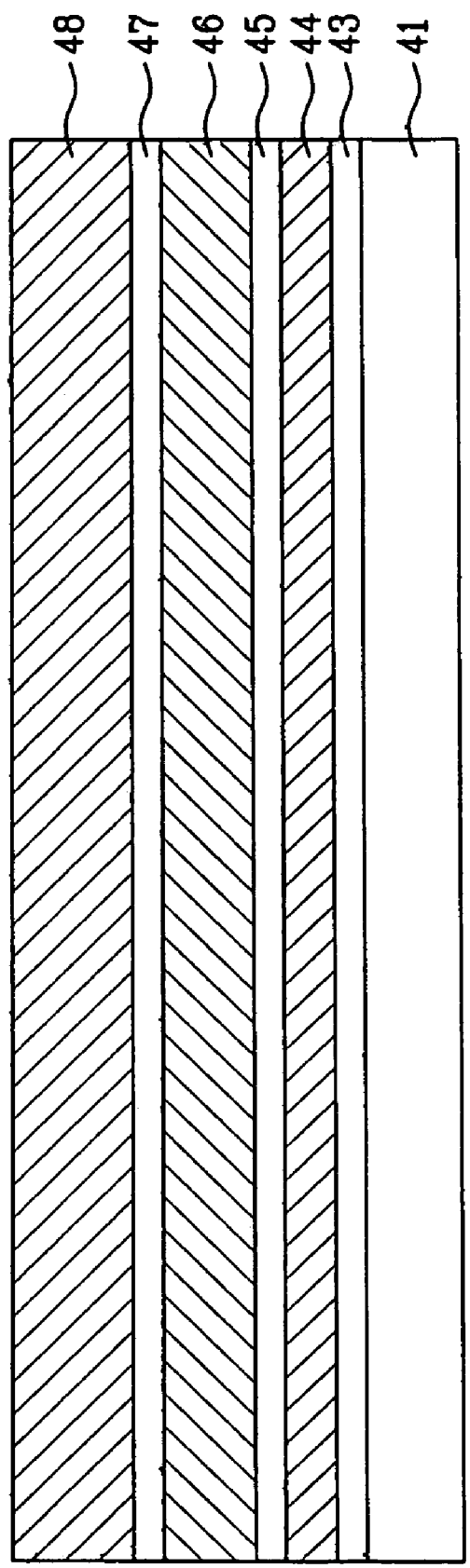

Referring to FIG. 4B, the buffer oxide layer 42 is removed, and then an ONO layer is formed thereon, wherein the ONO layer is formed by sequentially stacking a lower oxide layer, a trap nitride layer 44 and an upper oxide layer. At this time, the lower oxide layer-serves as a tunnel oxide layer 43, and the upper oxide layer serves as a block oxide layer 45. The lower oxide layer 43, the trap nitride layer 44 and the block oxide layer 45 are deposited by CVD (Chemical Vapor Deposition).

Subsequently, a polysilicon layer 46 is formed on the ONO layer having the stacked structure of the lower oxide layer 43, the trap nitride layer 44 and the block oxide layer 45, wherein the polysilicon layer 46 serves as a material layer for agate. Then, a first oxide layer 47 and a first nitride layer 48 are sequentially formed on the polysilicon layer 46, to form a cap insulating layer.

Figure 2:
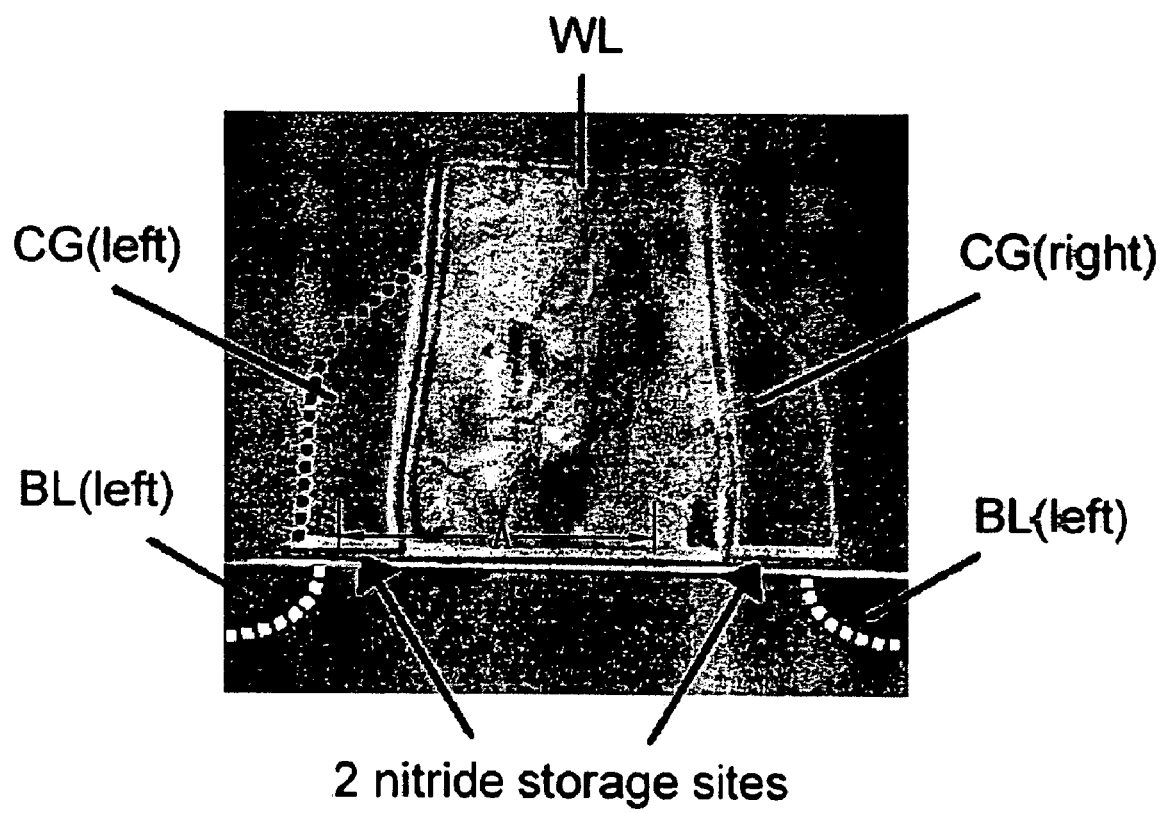
FIG. 2 is a cross-sectional view illustrating a related art Twin MONOS flash memory device.
Figure 4C:
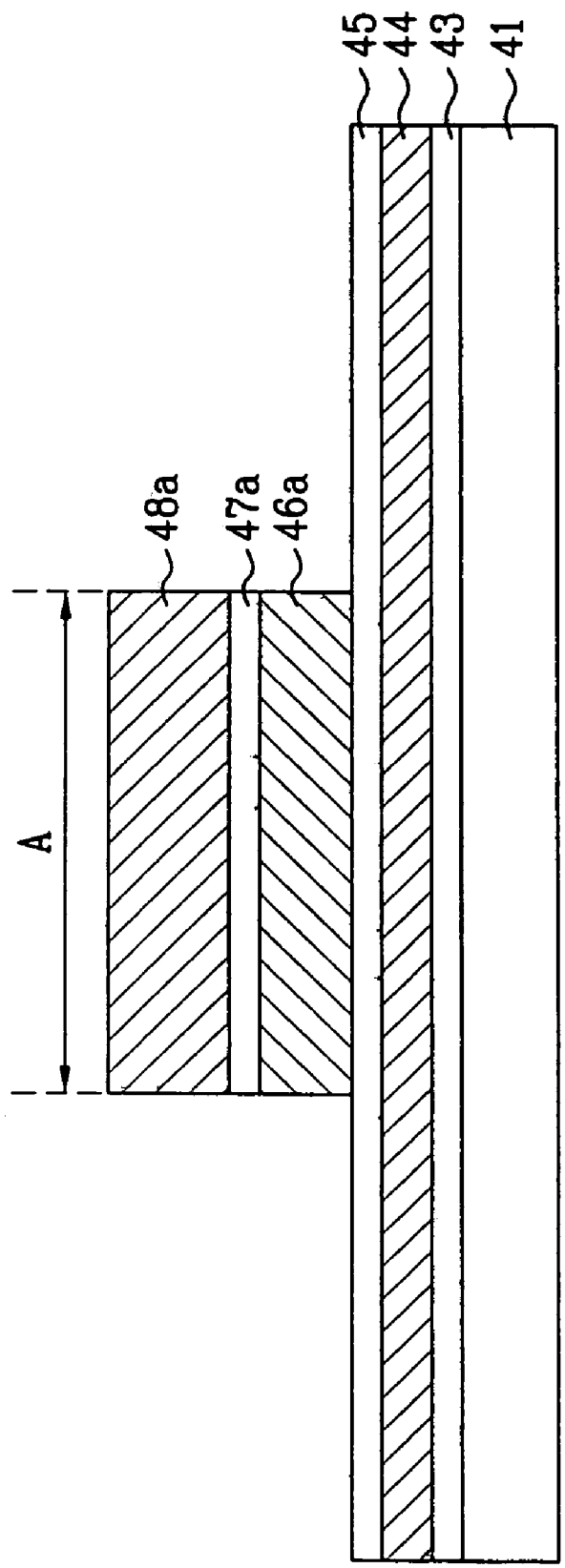

Referring to FIG. 4C, the first nitride layer 48 and the first oxide layer 47 are selectively etched as the gate patterning process to have a minimum line width 'A' by photolithography, thereby forming a gate pattern having a stacked structure of a polysilicon pattern layer 46a, an oxide pattern layer 47a and a nitride pattern layer 48a. After the etching process of the gate pattern 46a, 47a and 48a, the cleaning process is carried out. In this state, 'A' corresponding to the gate line width of FIG. 4C is the same size as 'A' corresponding to the gate line width of FIG. 2.

Figure 4D:
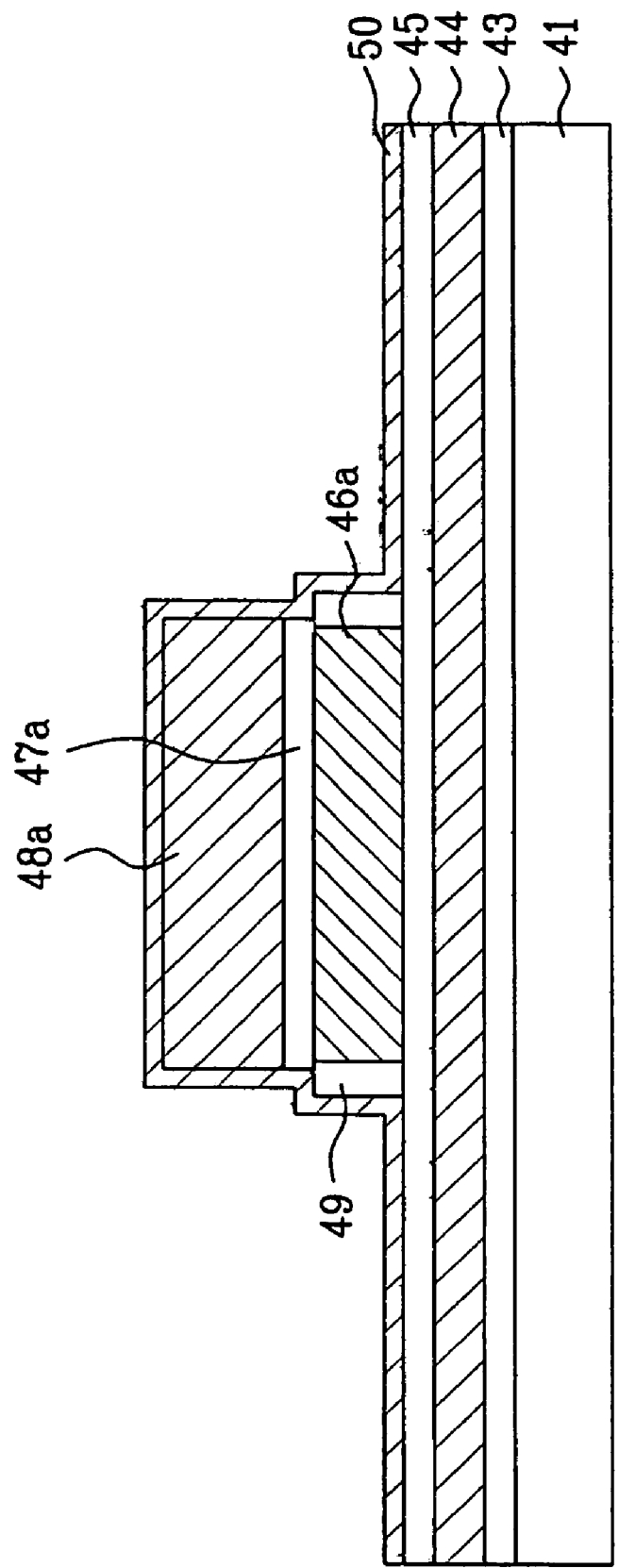

Subsequently, as shown in FIG. 4D, the exposed polysilicon pattern layer 46a of the gate pattern is oxidized to form second oxide layers 49 at both sidewalls of the polysilicon pattern layer 46a. Then, a nitride layer is deposited on an entire surface of the semiconductor substrate, thereby forming a second nitride layer 50. At this time, the second nitride layer 50 acts as a blocking layer on the planarization process.

Figure 4E:
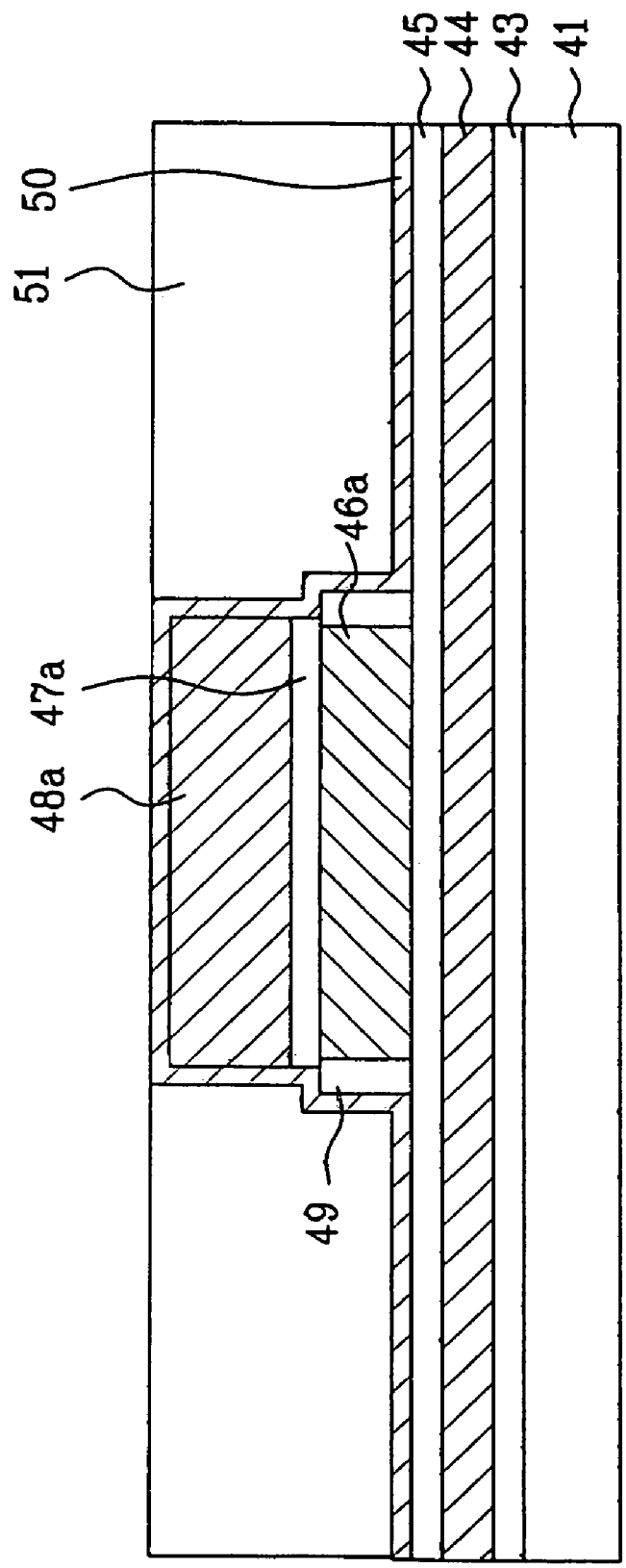
Figure 4F:
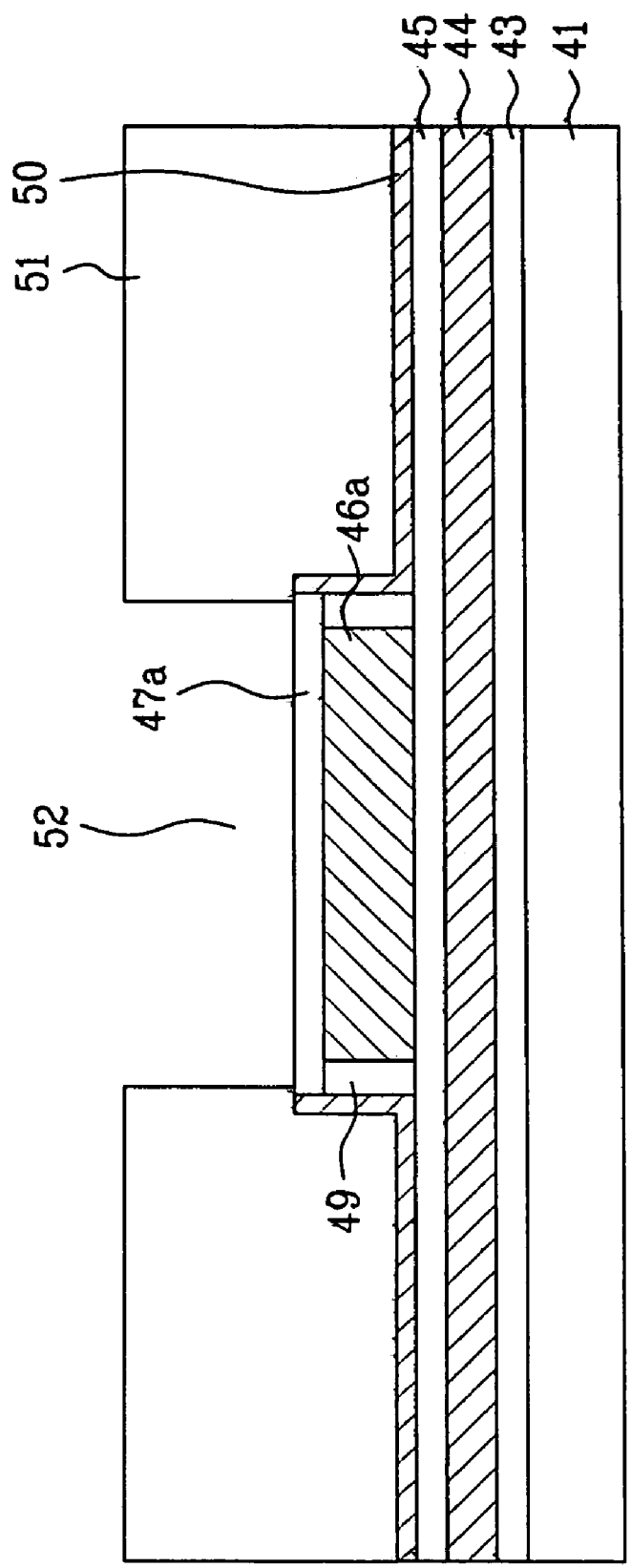

Referring to FIG. 4E, a third oxide layer 51 is deposited by CVD (Chemical Vapor Deposition), wherein the third oxide layer 51 acts as an insulating layer for planarization. Thereafter, the third oxide layer 51 is planarized by CMP (Chemical Mechanical Polishing) using a second nitride layer 50 as a blocking layer. Referring to FIG. 4F, a select gate formation 52 is defined by removing the exposed second nitride layer 50 and the nitride pattern layer 48a.

Figure 4G:
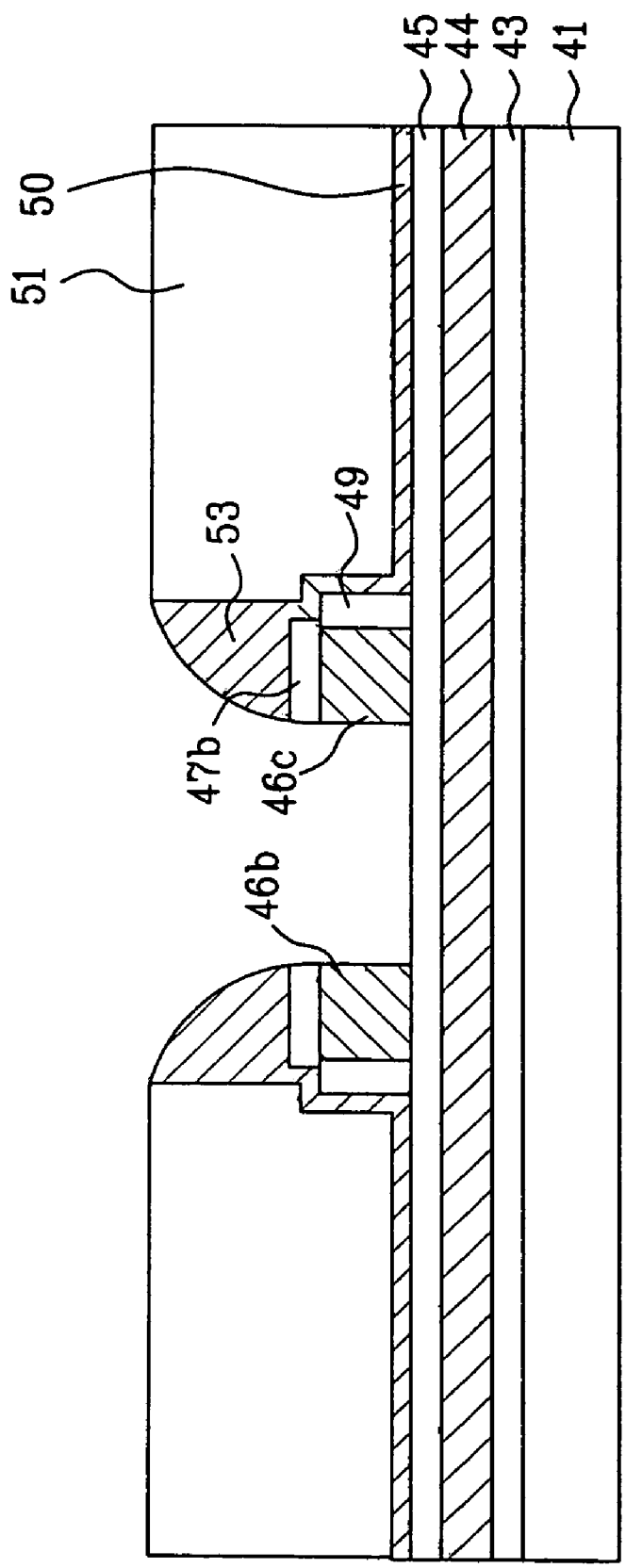

Subsequently, as shown in FIG. 4G, a nitride layer is deposited on the entire surface of the semiconductor substrate, the nitride layer used as a mask layer for the process of patterning control gates, and then the etch-back process is carried out thereto, thereby forming a mask pattern layer 53 as a sidewall shape in the select gate formation region 52. By using the mask pattern layer 53, the exposed polysilicon pattern layer 46a and the oxide pattern layer 47a are selectively etched, whereby control gates 46b and 46c are formed within the initial gate line width A. At this time, the oxide pattern layer 47a is aligned to the mask pattern layer 53 on the control gates 46b and 46c, and simultaneously etched, whereby some of the oxide pattern layer 47b remain.

Figure 4H:
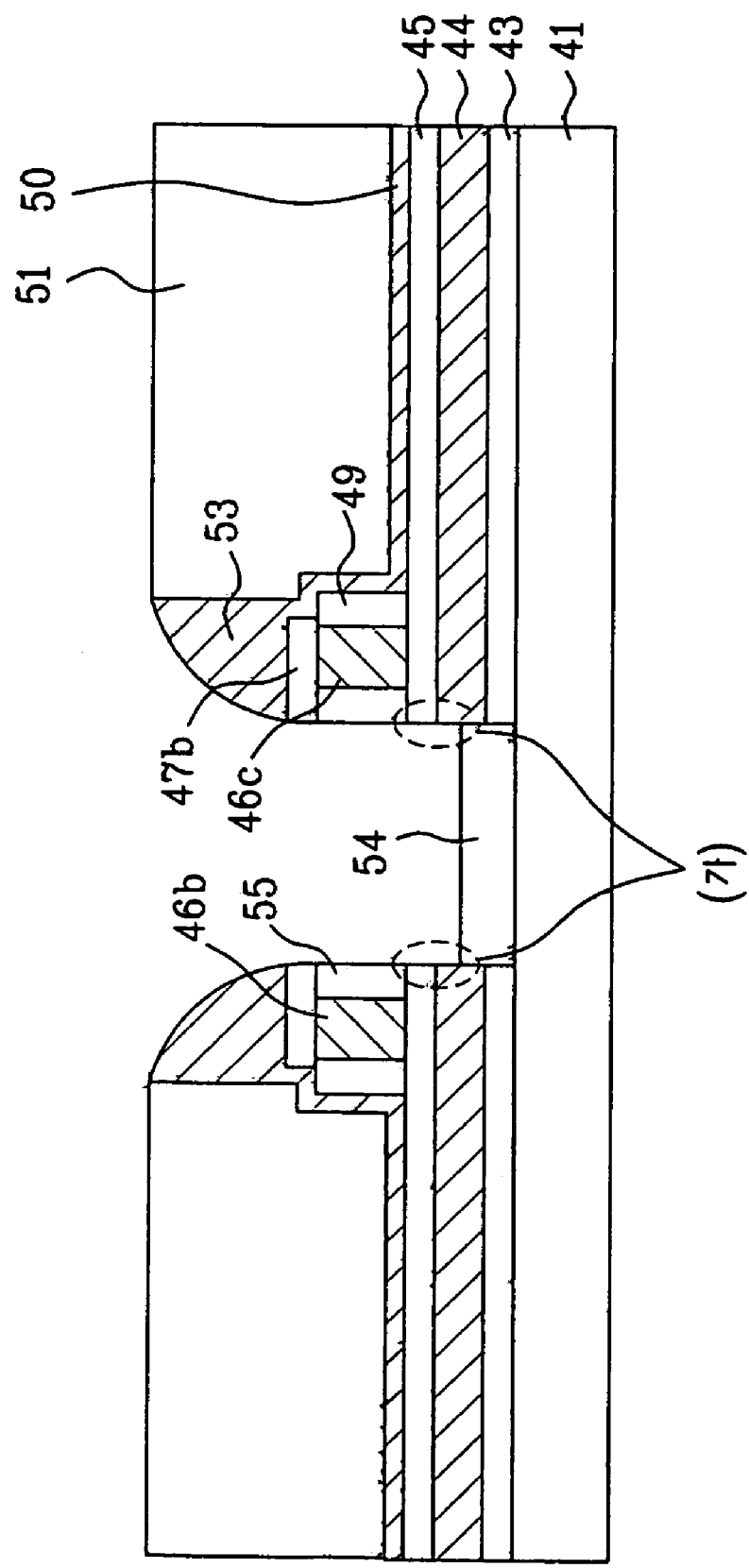

Subsequently, as shown in FIG. 4H, in state the mask pattern layer 53 remains, the exposed ONO layer 43, 44 and 45 is selectively and primarily removed, and a gate oxide layer 54 is formed to obtain insulation of the gate in the surface of the semiconductor substrate 41. In the gate oxidation process, although not shown, the side portions of the trap nitride layer 44 and the block oxide layer 45, corresponding to (ga), are oxidized, thereby forming oxide layers. Also, the inside portions of the control gates 46b and 46c are oxidized, thereby forming fourth oxide layers 55 at the side portions of the control gates 46b and 46c.

Figure 4I:
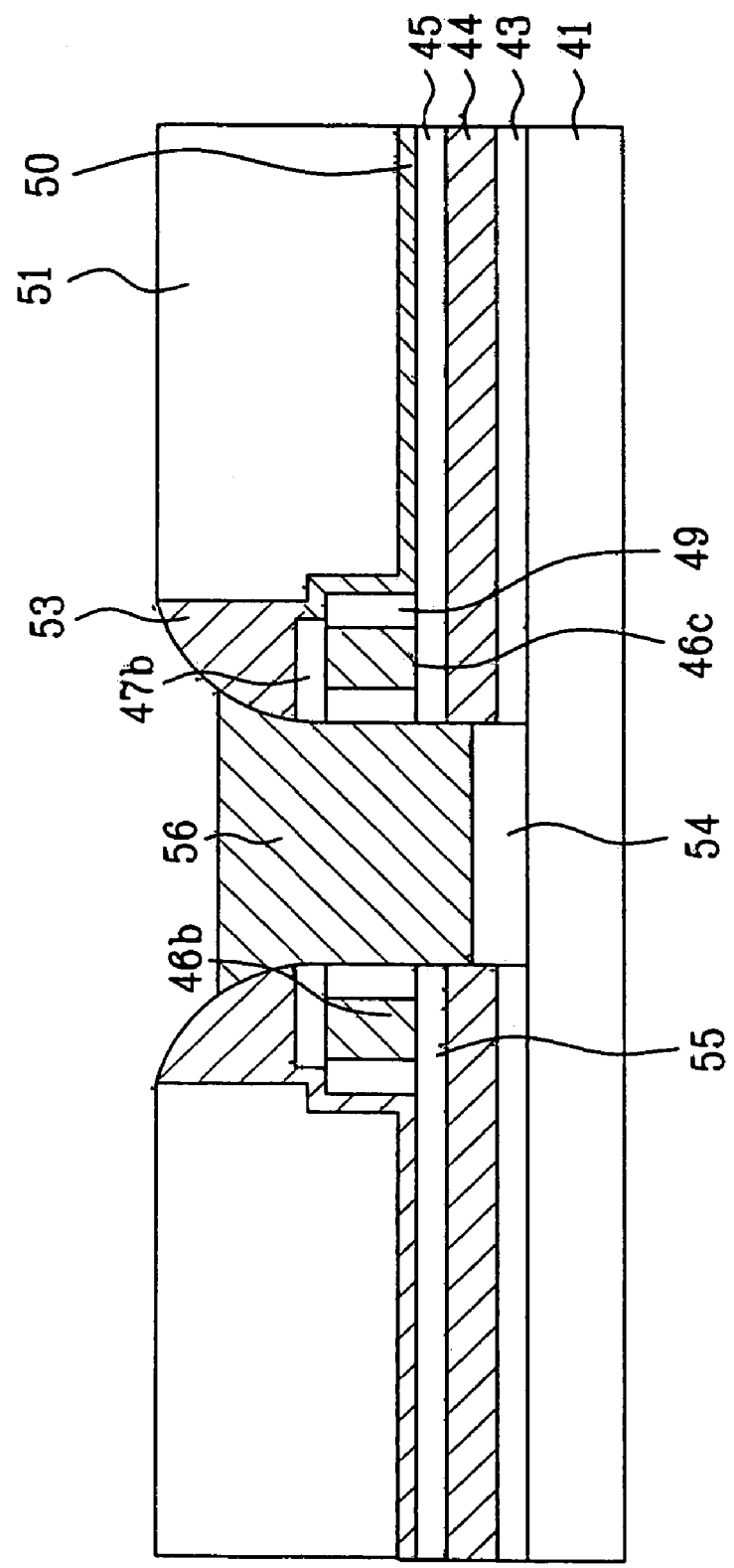
Figure 4J:
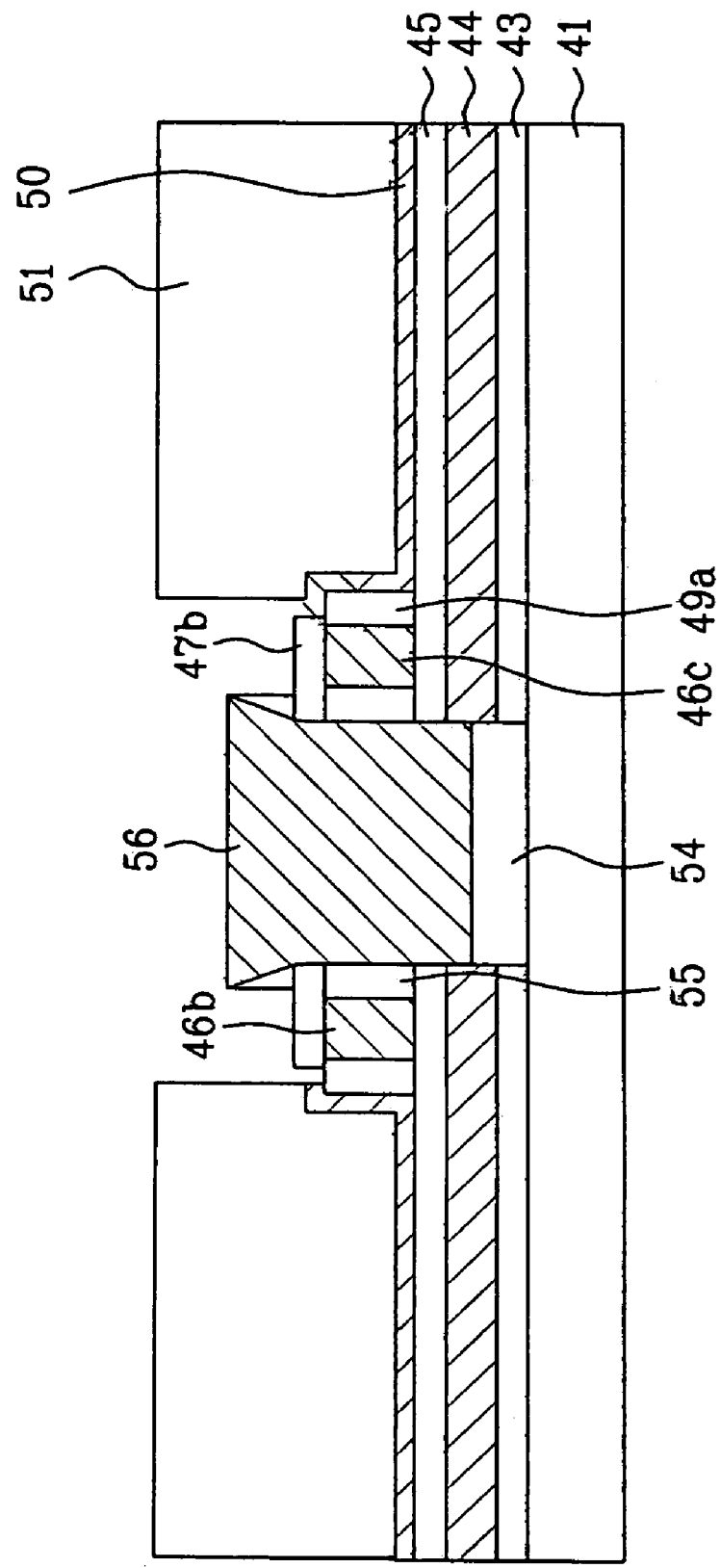
Figure 4K:
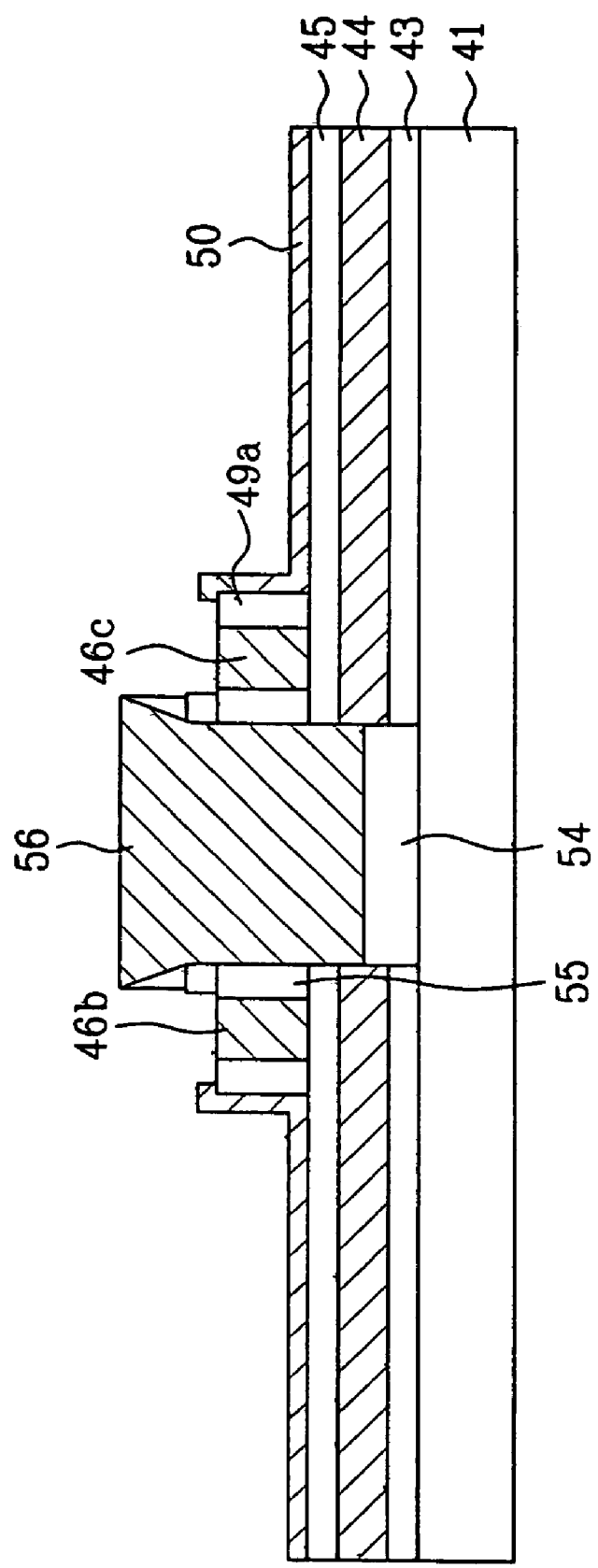
Figure 4L:
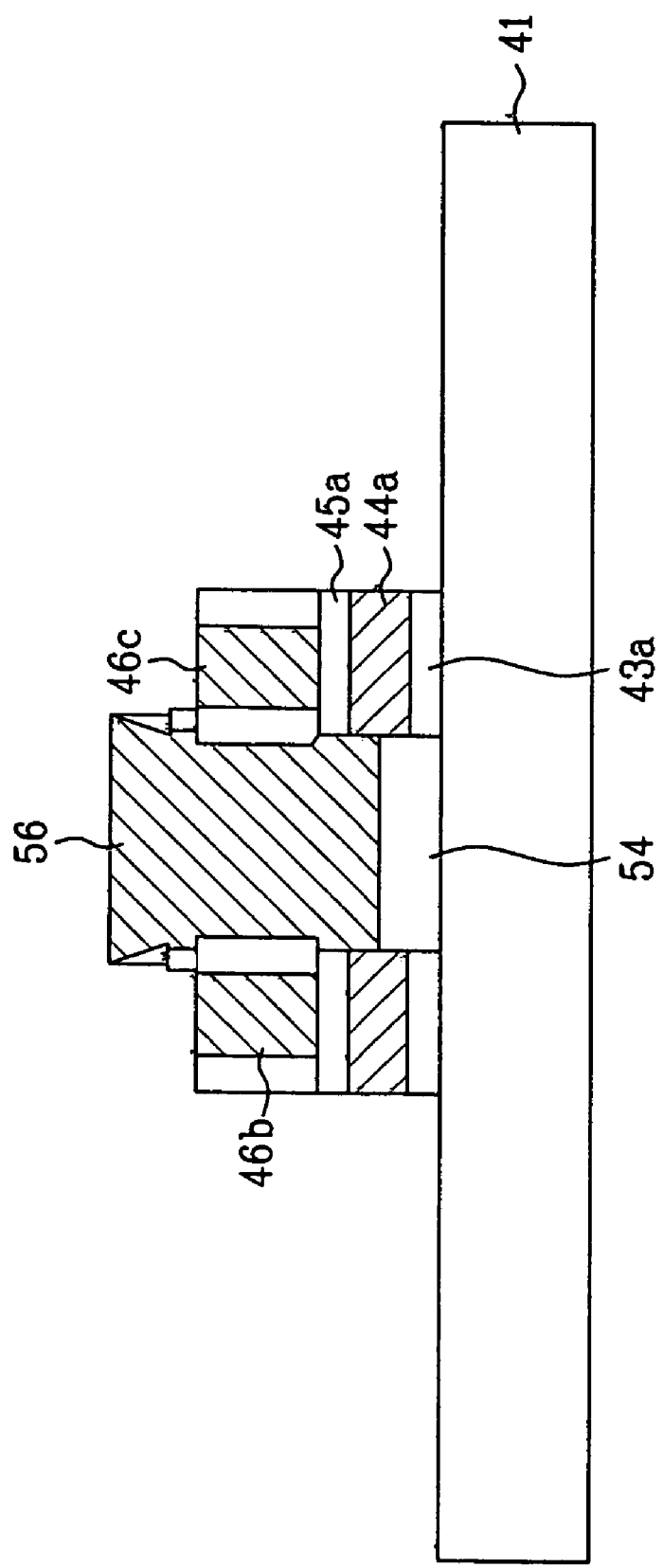

Referring to FIG. 4I, a polysilicon layer is deposited on the entire surface of the semiconductor substrate, the polysilicon layer acting as a material layer for formation of select gate, and then etch-back process is carried thereto, thereby forming a select gate 56. Subsequently, as shown in FIG. 4J, the nitride layer, used for the mask pattern layer 53 on formation of the select gate 56, is removed, and then the third oxide layer 51 is removed as shown in FIG. 4K. When removing the third oxide layer 51, the oxide pattern layer 47b on the control gate 46b and 46c is also removed. The etching process for removing the third oxide layer 51 is progressed in setting the second nitride layer 50 as an etch end point.

As shown in FIG. 4I, after removing the exposed second nitride layer 50, the lower oxide layer 43, the trap nitride layer 44 and the block oxide layer 45 are selectively and secondarily patterned by using the control gates 46b and 46c and the select gate 56 as a mask, thereby forming ONO layers 43a, 44a and 45a formed below the control gates 46b and 46c.

Figure 4M:
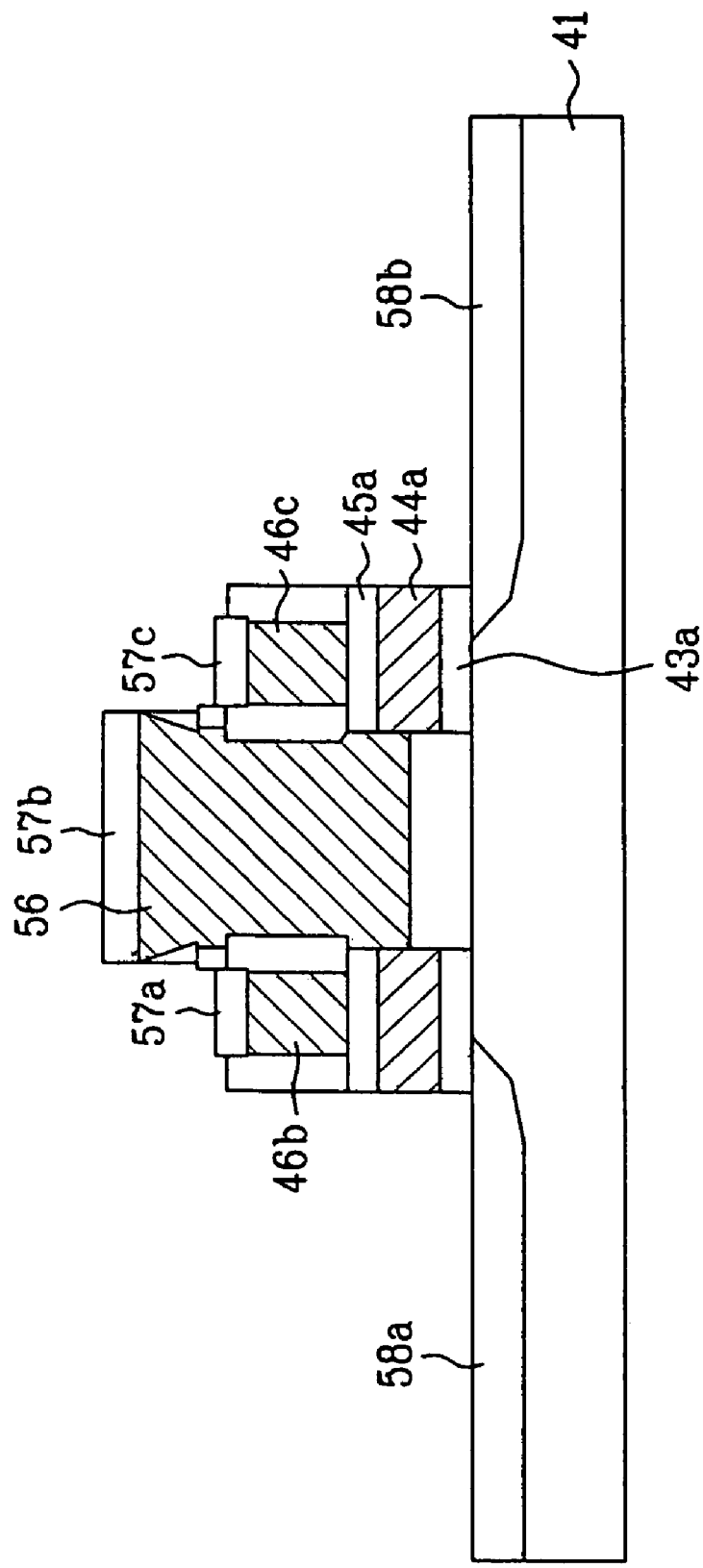

After that, as shown in FIG. 4M, the oxidation process is progressed, whereby cap gate insulating layers 57a, 57b and 57c are formed on the exposed surface of the control gates 46b and 46c and the select gate 56. Then, impurity ions are implanted into the surface of the semiconductor substrate 41 at both sides of the select gate 56, thereby forming source and drain junction regions 58a and 58b. Although not shown, the process for formation of an insulating interlayer, a contact region and upper lines is progressed.

In the flash memory device according to the present invention, when the control gates are formed at both sides of the select gate to improve efficiency of hole injection on the erasing operation mode, the control gates are formed within the minimum line width permitted in the fabrication process. Also, instead of forming the control gates by etch-back, the control gates of the sidewall type are formed by using the mask pattern to obtain the correct etching profile, whereby it is advantageous to realization on the fabrication process.

As mentioned above, the method for fabricating the flash memory device according to the present invention has the following advantages.

First, it is possible to improve efficiency of hole injection on the erasing operation mode by the cell structure having the control gate, thereby improving endurance.

Also, the control gate is formed in the etching process using the mask pattern layer, so that it is possible to obtain the correct pattern profile, thereby obtaining the great realization on the fabrication process.

In addition, the control gate is formed within the minimum line width (A) permitted in the fabrication process, whereby it is advantageous to miniaturization of the device and improvement of cell integration.

Furthermore, instead of forming the control gate by etch-back, the control gate of the sidewall type are formed by using the mask pattern to obtain the correct etching profile, so that it is possible to decrease the problems of the fabrication process.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for fabricating a flash memory device comprising:

forming a gate pattern layer having a minimum line width (A) by stacking a material layer for gate and a cap insulating layer on an ONO layer of a semiconductor substrate, and primarily etching the stacked layers;

forming an insulating layer for planarization on an entire substrate of the semiconductor substrate, and removing the cap insulating layer, to define a select gate formation region;

forming a mask pattern layer of a sidewall shape in the select gate formation region, and secondarily etching the gate pattern layer by using the mask pattern layer, to form control gates; and forming a select gate isolated from the control gates in the select gate formation region, and forming source and drain junction regions in the surface of the semiconductor substrate at both sides of the select gate.

2. The method of claim 1, wherein the cap insulating layer is formed by stacking an oxide layer and a nitride layer, the nitride layer is removed in the process of defining the select gate formation region, and the oxide layer remains.

3. The method of claim 1, wherein, before forming the insulating layer for planarization, the side portions of the exposed material layer for gate are oxidized, and a nitride layer acting as an etch-blocking layer is formed on the entire surface of the semiconductor substrate.

4. The method of claim 1, wherein the ONO layer is primarily patterned by using the mask pattern layer after formation of the control gates, and then secondarily patterned after formation of the select gate, so that the ONO layer remains below the control gates.

5. The method of claim 1 or claim 4, wherein, after formation of the select gate, it is required to remove the mask pattern layer, the remaining insulating layer for planarization, the remaining cap insulating layer below the mask pattern layer, and the nitride layer used as the blocking layer in CMP process for forming the insulating layer for planarization, and then the ONO layer is patterned secondarily.

6. The method of claim 4, wherein, after primarily patterning the ONO layer using the mask pattern layer, a gate oxide layer is formed within the select gate formation region in the surface of the semiconductor substrate.

7. The method of claim 6, wherein, after formation of the gate oxide layer, a polysilicon layer is formed to bury the select gate formation region, and then anisotropic-etched to remain on the select gate formation region, thereby forming the select gate.

8. The method of claim 1, wherein a cap gate insulating layer is formed in a method of oxidizing the upper surfaces of the select gate and the control gates before the ion implantation process to form the source and drain junction regions.

\* \* \* \* \*